US012051575B2

(12) United States Patent
Okamoto et al.

(10) Patent No.: US 12,051,575 B2
(45) Date of Patent: *Jul. 30, 2024

(54) PLASMA PROCESSING APPARATUS AND PLASMA PROCESSING METHOD

(71) Applicant: Hitachi High-Tech Corporation, Tokyo (JP)

(72) Inventors: Tsubasa Okamoto, Tokyo (JP); Ryoji Asakura, Hillsboro, OR (US); Soichiro Eto, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 303 days.

This patent is subject to a terminal disclaimer.

(21) Appl. No.: 17/482,595

(22) Filed: Sep. 23, 2021

(65) Prior Publication Data

US 2022/0102122 A1 Mar. 31, 2022

Related U.S. Application Data

(63) Continuation-in-part of application No. 17/038,024, filed on Sep. 30, 2020, now Pat. No. 11,437,289.

(51) Int. Cl.
| | |
|---|---|
| *H01L 21/66* | (2006.01) |
| *G01B 11/06* | (2006.01) |
| *H01J 37/32* | (2006.01) |

(52) U.S. Cl.
CPC .... *H01J 37/32963* (2013.01); *G01B 11/0675* (2013.01); *H01L 22/26* (2013.01);
(Continued)

(58) Field of Classification Search
CPC .......... G01B 11/0675; H01L 21/67069; H01L 21/32137; H01L 21/67253; H01J 37/32963
See application file for complete search history.

(56) References Cited

U.S. PATENT DOCUMENTS

| 4,675,072 A | 6/1987 | Bennett |
| 6,824,813 B1 | 11/2004 | Lill |
| (Continued) | | |

FOREIGN PATENT DOCUMENTS

| JP | 2001085388 A | 3/2001 |
| JP | 2002081917 A | 3/2002 |
| (Continued) | | |

OTHER PUBLICATIONS

Non-Final Office Action dated Oct. 4, 2021 in U.S. Appl. No. 17/038,024.

*Primary Examiner* — Binh X Tran
(74) *Attorney, Agent, or Firm* — Miles & Stockbridge, P.C.

(57) ABSTRACT

Provided is a processing state detection unit includes: a light emission detection unit configured to detect light emission of the plasma; a calculation unit configured to obtain a differential waveform data of the light emission of the plasma; a database unit that stores a plurality of pieces of differential waveform pattern data in advance; a film thickness calculation unit configured to calculate an estimated value of the film thickness of the processing target film processed on the processing target material by weighting based on differences between the differential waveform data obtained by the calculation unit and the plurality of pieces of differential waveform pattern data stored in the database unit; and an end point determination unit configured to determine an end point of processing using the plasma based on the estimated value of the film thickness of the processing target film calculated by the film thickness calculation unit.

9 Claims, 11 Drawing Sheets

(52) U.S. Cl.
CPC .............. *H01J 2237/24585* (2013.01); *H01J 2237/332* (2013.01)

(56) References Cited

U.S. PATENT DOCUMENTS

| | | |
|---|---|---|
| 11,437,289 B2 * | 9/2022 | Fukuchi ............ H01L 21/67253 |
| 2003/0211738 A1 | 11/2003 | Nagata |
| 2007/0202613 A1 | 8/2007 | Usui et al. |
| 2014/0295583 A1 | 10/2014 | Nakamoto et al. |
| 2016/0211186 A1 * | 7/2016 | Nakamoto ........ H01J 37/32972 |
| 2016/0284610 A1 * | 9/2016 | Usui ...................... H01L 22/20 |
| 2016/0336154 A1 | 11/2016 | Watanabe et al. |
| 2016/0351405 A1 | 12/2016 | Fukuchi et al. |
| 2018/0269119 A1 * | 9/2018 | Coppa ............... H01L 21/31116 |
| 2018/0277377 A1 * | 9/2018 | Eto .................. H01J 37/32009 |
| 2022/0148862 A1 * | 5/2022 | Lian ................. H01J 37/32963 |

FOREIGN PATENT DOCUMENTS

| | | | |
|---|---|---|---|
| JP | 2003083720 A | | 3/2003 |
| JP | 2007234666 A | | 9/2007 |
| JP | 2010034582 A | | 2/2010 |
| JP | 2016184638 A | | 10/2016 |

\* cited by examiner

FIG. 3A

| | |
|---|---|
| $r(1)\ s-1$ | ... |
| | 151.3 |
| $r(1)\ s$ | 149.8 |
| | ... |
| $r(m)\ s-1$ | 152.4 |
| $r(m)\ s$ | 150.1 |
| | ... |

| | | | | |
|---|---|---|---|---|
| | ... | ... | ... | ... |
| $Q(1)\ s-1,\ 1$ | 0.52 | 0.43 | ... | 0.36 |
| $Q(1)\ s,\ 1$ | 0.61 | 0.57 | ... | 0.37 |
| | ... | ... | ... | ... |
| $Q(m)\ s-1,\ 1$ | 0.36 | 0.42 | ... | 0.34 |
| $Q(m)\ s,\ 1$ | 0.38 | 0.43 | ... | 0.35 |
| | ... | ... | ... | ... |

Q:302

PLASMA PROCESSING APPARATUS AND PLASMA PROCESSING METHOD

BACKGROUND OF THE INVENTION

1. Field of the Invention

The present invention relates to a processing apparatus and a processing method for a processing target material in manufacture of a semiconductor integrated circuit and the like, and particularly relates to a plasma processing apparatus and a plasma processing method suitable for accurately detecting etching amounts of various layers provided on a substrate by etching processing using plasma discharge and processing to a desired film thickness and etching depth.

2. Description of the Related Art

In manufacture of a semiconductor device, a process using a dry etching apparatus is widely used for removal or pattern formation of layers of various materials and particularly layers of dielectric materials formed on a surface of a semiconductor wafer.

In the dry etching apparatus, processing gas introduced into a vacuum processing chamber is converted into plasma containing ions and radicals, and the ions and radicals are reacted with the layers formed on the surface of the semiconductor wafer, thereby performing an etching process of the semiconductor wafer.

What is important in the etching process is to accurately detect an etching end point for stopping the etching process at the desired film thickness and etching depth during the processing of such a layer.

During dry etching processing of the semiconductor wafer, an emission intensity of a specific wavelength in plasma light changes as etching of a specific film progresses. Therefore, as one method for determining the etching end point of the semiconductor wafer, in related arts, there is a method in which in a dry etching processing, a change in an emission intensity of a specific wavelength from plasma is detected, and an etching end point of a specific film is detected based on the detection result.

As an example of such a technique in the related arts, a technique described in JP-A-2007-234666 (PTL 1) has been known. In the technique in the related art, a method of performing end point determination based on a time change of an amount of reflected light from a semiconductor wafer during etching is described.

Since the amount of the reflected light from the semiconductor wafer changes depending on film thicknesses of layers other than a layer being processed, JP-A-2016-184638 (PTL 2) has been known in the related arts as a method for accurately detecting an end point under such a condition. In the technique in the related art, a highly accurate film thickness estimation method when a film thickness of a layer under a processing target film (base film thickness) is different is disclosed.

PTL 1 discloses a method of obtaining a characteristic behavior of time change of interference light by detection, creating a database based on the behavior, and determining the end of etching by comparing the database and a detected interference waveform. The database is created by setting a standard pattern showing a wavelength dependence of the interference light with respect to an etching amount of a processing target material such as a semiconductor wafer that is used for samples (semiconductor wafer used for samples) when plasma etching the processing target material.

PTL 2 describes preparing interference spectrum patterns (interference patterns) with different base film thicknesses as databases, creating a database generated by synthesizing two databases, comparing the synthesized database and a detected interference pattern, calculating an estimated film thickness value at each time point, and determining the end point.

However, in the above-described related arts, in addition to the base film thickness, a mask film thickness varies, a mask width varies, and the film thickness varies depending on a position on the semiconductor wafer of the processing target film, and when various variations such as the above ones occur in a fine shape of a semiconductor wafer surface, highly accurate film thickness estimation cannot be achieved.

For example, consider a case where the base film thickness and the mask film thickness are different, and the fine shape of the semiconductor wafer to be processed has a slightly thick base film thickness or a slightly thick mask film thickness. In this case, it is necessary to prepare a database of interference spectrum patterns obtained from four semiconductor wafers whose base film thickness is thick or thin and whose the mask film thickness is thick or thin, and to synthesize the above appropriately, whereas neither PTL 1 nor PTL 2 discloses such a method.

SUMMARY OF THE INVENTION

In consideration of the above-mentioned problems of the related arts, an object of the present invention is to provide a plasma processing apparatus and a plasma processing method that can accurately detect or control the remaining film thickness of the processing target film even when two or more variations occur in the fine shape of the semiconductor wafer surface (for example, the base film thickness and the mask film thickness).

In order to achieve the above object, a plasma processing apparatus according to the invention includes: a vacuum processing chamber configured to generate plasma in a state where an inside of the vacuum processing chamber is exhausted to vacuum, so as to process a processing target material; a processing state detection unit configured to detect a state of a processing target film of the processing target material which is processed inside the vacuum processing chamber; and a control unit configured to control the vacuum processing chamber and the processing state detection unit. The processing state detection unit includes: a light emission detection unit configured to detect light emission of the plasma generated inside the vacuum processing chamber; a calculation unit configured to obtain a differential waveform data of the light emission of the plasma detected by the light emission detection unit; a database unit that stores a plurality of pieces of differential waveform pattern data in advance; a film thickness calculation unit configured to calculate an estimated value of the film thickness of the processing target film processed on the processing target material by weighting based on differences between the differential waveform data obtained by the calculation unit and the plurality of pieces of differential waveform pattern data stored in the database unit; and an endpoint determination unit configured to determine an end point of processing using the plasma based on the estimated value of the film thickness of the processing target film calculated by the film thickness calculation unit.

In order to achieve the above object, a plasma processing method using a plasma processing apparatus in which plasma is generated and a processing target film formed on a processing target material is processed in a state where an inside of a vacuum processing chamber is exhausted to vacuum, including: a step of detecting, by a light emission detection unit, light emission of the plasma generated inside the vacuum processing chamber; a step of obtaining, by a calculation unit, a differential waveform data of the light emission of the plasma detected by the light emission detection unit; a step of calculating, by a film thickness calculation unit, an estimated value of the film thickness of the processing target film processed on the processing target material by weighting based on a difference between the differential waveform data obtained by the calculation unit and a plurality of differential waveform pattern data stored in a database unit; and a step of determining, by an end point determination unit, an end point of processing using the plasma based on the estimated value of the film thickness of the processing target film calculated by the film thickness calculation unit.

Further, in order to achieve the above object, a plasma processing method using a plasma processing apparatus that generates plasma in a state where an inside of a vacuum processing chamber is exhausted to vacuum, so as to process a processing target film formed on a processing target material detects, by a light emission detection unit, light emission of the plasm generated inside the vacuum processing chamber; obtains, by a calculation unit, a differential waveform data of the light emission of the plasma detected by the light emission detection unit; calculates, by a film thickness calculation unit, an estimated value of the film thickness of the processing target film processed on the processing target material by weighting based on a difference between the differential waveform data obtained by the calculation unit and a plurality of pieces of differential waveform pattern data stored in a database unit; processes the processing target film until the estimated value of the film thickness calculated by the film thickness calculation unit reaches a predetermined remaining film thickness; and further processes the processing target film by a processing time obtained by an additional processing time calculator and required for the predetermined remaining film thickness to reach a target film thickness when the estimated value of the film thickness calculated by the film thickness calculation unit has reached the predetermined remaining film thickness.

According to the invention, even when various variations occur in the fine shape of the semiconductor wafer, a processing amount or a remaining film thickness of the processing target film can be detected with high accuracy.

According to the invention, highly accurate film thickness estimation and end point determination under various structural variations between wafers, lots, and the like can be achieved, and a yield of device manufacturing can be improved.

BRIEF DESCRIPTION OF THE DRAWINGS

FIG. 3A is an explanatory diagram of matrix data used in calculation according to the embodiment of the invention.

FIG. 3B is an explanatory diagram of the matrix data used in the calculation according to the embodiment of the invention.

DESCRIPTION OF THE PREFERRED EMBODIMENTS

Figure 1:
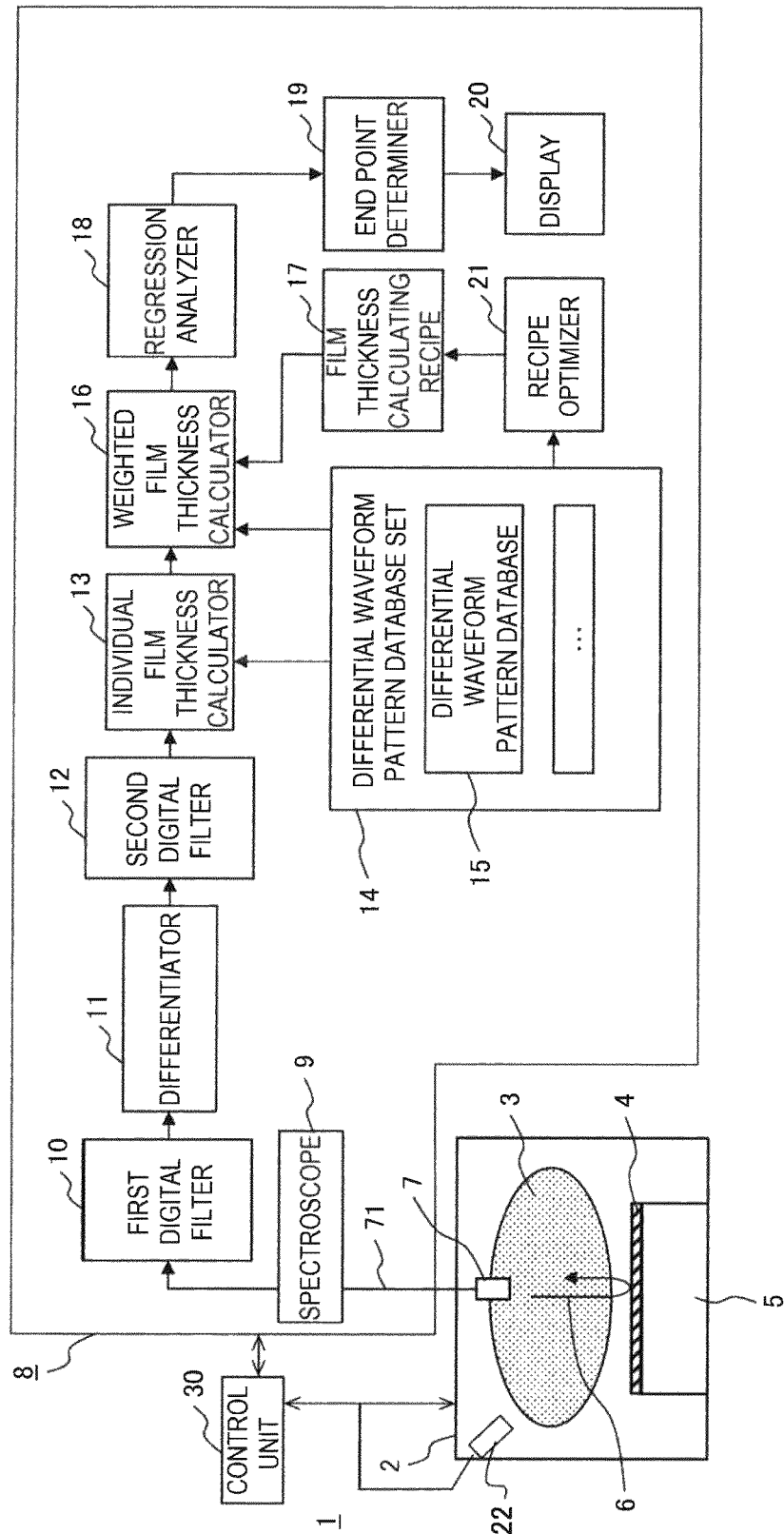
FIG. 1 is a block diagram showing a schematic configuration of a plasma processing apparatus according to an embodiment of the invention.

According to the invention, a plasma processing apparatus is equipped with an etching amount measuring unit having a plurality of interference spectra of various film thicknesses and structures in databases. The etching amount measuring unit mixes the film thicknesses of the databases based on distances between an interference spectrum during etching and the databases, and determines an estimated film thickness value, and thereby film thickness estimation with high accuracy can be achieved even in a case where variations exist in film thickness and structure other than the base film thickness.

A specific procedure for estimating the film thickness in the invention will be described below.

(a) Prepare a plurality of databases having different interference spectrum patterns due to various film thicknesses and structures.
(b) Calculate weights according to differences between the interference spectrum pattern during wafer processing and the patterns of the interference spectra of the databases, and calculate the estimated film thickness value by using the weights and the film thickness values of the databases.
(c) Determine that a target is reached by using the estimated film thickness.

Here, as for explaining the calculation of the estimated film thickness value more specifically, a wavelength range of an interference spectrum is optimized by using data on interference spectrum and film thickness collected in advance. Specifically, a wavelength range in which interference spectra have a large variation in the same film thickness is excluded, and accuracy is evaluated by mutual film thickness estimation between databases. If the accuracy is good, the wavelength range is used for the film thickness estimation.

In the present invention, in the plasma processing apparatus and the plasma processing method, by using three or more interference light patterns for synthesis weighted in accordance with a value of a difference between an actual interference light pattern during processing and the actual interference light pattern for synthesis, and synthesizing film thicknesses respectively calculated from the interference light patterns for synthesis according to the weights, the film thickness during processing can be detected.

According to the invention, considering that fine shapes on semiconductor wafer surfaces are different, differential waveform pattern databases of the interference light obtained from a plurality of semiconductor wafers are registered, a time derivative for each of the plurality of wavelengths of the interference light obtained from the semiconductor wafer surface during the etching processing is obtained, a differential value pattern of the waveform of the interference light is obtained, and weights based on the pattern differences between the pattern and the plurality of differential waveform pattern databases are respectively calculated for the differential waveform pattern databases.

The invention relates to a plasma processing apparatus and a plasma processing method capable of detecting the remaining film thickness of the processing target film with high accuracy by calculating a weighted sum of film thicknesses calculated from the differential waveform pattern databases using the weights described above, by using pattern databases whose fine shapes are more similar to that of the processing target semiconductor wafer.

Hereinafter, an embodiment according to the invention will be described in detail with reference to drawings. In all the drawings for explaining the present embodiment, those having same functions are denoted by same reference numerals, and repeated descriptions thereof will be omitted in principle.

However, the invention should not be construed as being limited to the description of the embodiment described below. Those skilled in the art could have easily understood that specific configurations can be changed without departing from the spirit or scope of the invention.

First Embodiment

Hereinafter, with reference to FIGS. 1 to 5, an overall configuration of the plasma processing apparatus for a semiconductor wafer provided with means for detecting the etching amount (here, the actual etching depth and the film thickness of the processing material) according to the invention will be described.

The plasma processing apparatus according to the embodiment of the invention is shown in FIG. 1. The plasma processing apparatus 1 includes a vacuum processing chamber 2, an etching amount measuring unit 8, and a control unit 30.

The vacuum processing chamber 2 includes, on an inside thereof, a sample table 5 on which a processing target material 4 such as a semiconductor wafer is placed, a light receiver 7 for detecting light emitted from the plasma 3 generated inside, an optical fiber 71 that transmits the light emitted from the plasma 3 received by the light receiver 7, and a light source 22 that irradiates the processing target material 4 with light. The vacuum processing chamber 2 further includes a gas introducing unit for introducing gas into the inside, a vacuum exhausting unit for exhausting the inside into vacuum, a power supply unit for supplying electric power, and the like (not shown for the sake of simplicity).

The etching amount measuring unit 8 includes a spectroscope 9, a first digital filter 10, a differentiator 11, a second digital filter 12, an individual film thickness calculator 13, a differential waveform pattern database set 14, a differential waveform pattern database 15, a weighted film thickness calculator 16 for calculating a film thickness 210 of the processing target film, a film thickness calculating recipe 17 used for calculation of the weighted film thickness calculator 16, a regression analyzer 18, an end point determiner 19 that determines the end of etching based on a result of the regression analyzer 18, a display 20 that displays a determination result of the end point determiner 19, and a recipe optimizer 21 that optimizes the values of the film thickness calculating recipe 17.

The etching amount measuring unit 8 in FIG. 1 shows a functional configuration, and an actual configuration of the etching amount measuring unit 8 excluding the display 20 and the spectroscope 9 can include: a CPU; a storage device including a ROM that holds various data such as an etching depth and film thickness detection processing program and a differential waveform pattern database of interference light 6, a RAM for holding detection data, and an external storage device; a data input and output device; and a communication control device.

The control unit 30 receives a signal from the etching amount measuring unit 8 and a signal from the outside, and controls the gas introducing unit, the vacuum exhausting unit, the power supply unit, and the like (not shown) connected to the vacuum processing chamber 2.

Etching gas introduced into the inside of the vacuum processing chamber 2 from the gas introducing unit (not shown) is decomposed into the plasma 3 by microwave power or the like supplied from the power supply unit (not shown), and the plasma etches the processing target material 4, such as the semiconductor wafer, on the sample table 5.

The light emitted from the plasma 3 is directly received by the light receiver 7, or is partially received by the light receiver 7 after being reflected by the processing target material 4 such as a semiconductor wafer, such as the interference light 6, and is introduced into the spectroscope 9 from the vacuum processing chamber 2 through the optical fiber 71. In the spectroscope 9, the incident light emission of the plasma is separated and light intensities are converted into a digital signal. Instead of emitting light from the plasma 3, light may be irradiated from the light source 22 to the processing target material 4, and reflected light may be measured by the spectroscope 9.

Figure 2A:
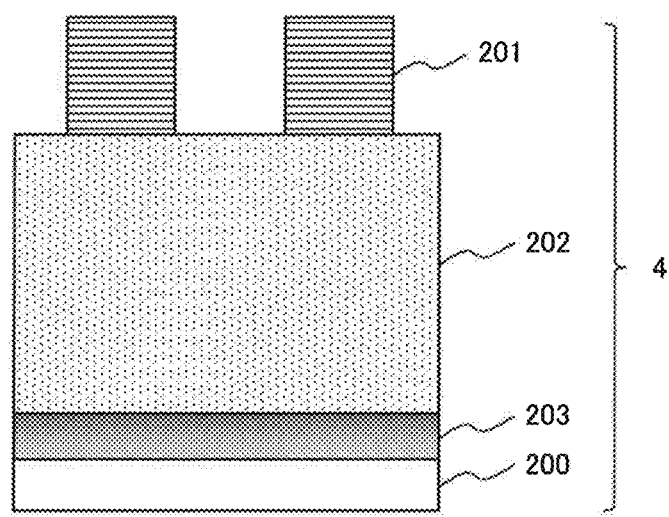
FIG. 2A is a cross-sectional view of a processing target material according to the embodiment of the invention, showing a state before processing.

FIG. 2A shows a fine shape of a surface of the processing target material 4, which is to be etched. The processing target material 4, such as a semiconductor wafer, is formed by laminating, for example, a processing target film 202 containing polysilicon or the like and a base film 203 including an oxide film or the like on a silicon substrate 200. A pattern of the mask 201 made of a resist or the like is formed on the processing target film 202.

Figure 2B:
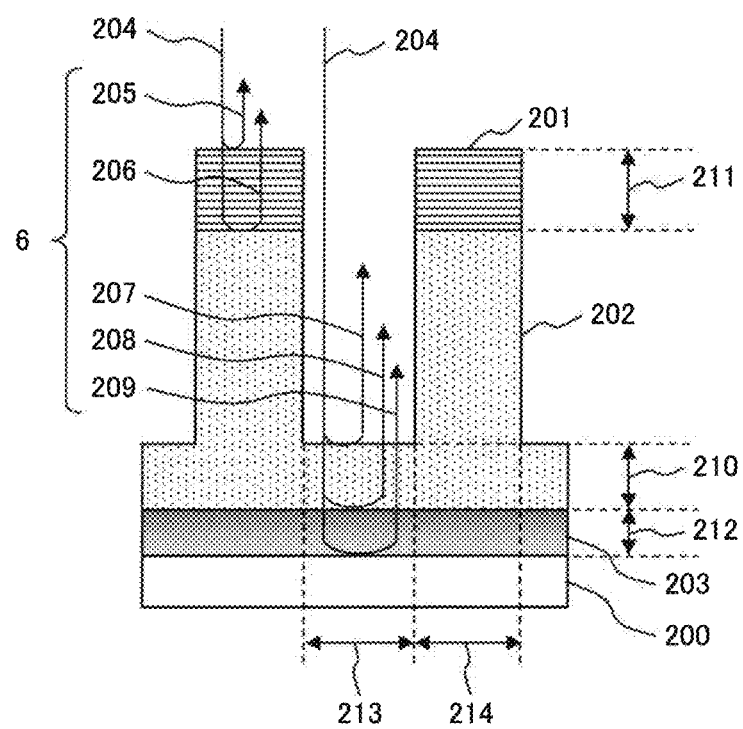
FIG. 2B is a cross-sectional view of the processing target material according to the embodiment of the invention, showing a state during the processing.

FIG. 2B is a schematic view when the processing target film 202 is being etched. The plasma light 204 incident on the processing target material 4 is reflected on the surface of the processing target material 4, in which, first, reflected light 205 on the surface of the mask 201 and reflected light 206 at a boundary between the mask 201 and the processing target film 202 exist. Also, reflected light 207 on the surface of the processing target film 202 in a part where the processing target film 202 is exposed and not covered with the mask 201, reflected light 208 at a boundary between the processing target film 202 and the base film 203, and reflected light 209 at a boundary between the base film 203 and the silicon substrate 200 exist.

Interference light is formed because an optical path difference occurs between the reflected lights. Since a thickness of the processing target film 202 decreases as the etching progresses, the optical path difference of each reflected light changes, and an interference phenomenon having a different period for each wavelength occurs. Among the multi-wavelength interference lights 6, multi-wavelength interference light 6 received by the light receiver 7 is guided to the spectroscope 9 of the etching amount measuring unit 8 via the optical fiber 71, and based on this state, the etching amount of the processing target film 202 is measured and the end point determination of a process (here, etching) is performed.

In FIG. 2B, the film thickness as a film thickness to be detected is the film thickness 210 of the processing target film 202. However, the multi-wavelength interference light 6 received by the light receiver 7 and measured by the spectroscope 9 varies depending on variations in the fine shape of the semiconductor wafer, such as variations for each of the mask film thickness 211, the base film thickness 212, an area ratio of processing target film area 213 to a mask area 214, and a position on the semiconductor wafer of the film thickness 210 of the processing target film. The variations are main reason of errors in detecting the film thickness 210 of the processing target film.

The multi-wavelength interference light 6 with respect to the processing target material 4 taken in by the spectroscope 9 becomes current detection signals corresponding to the emission intensities of the wavelengths respectively, and the current detection signals are converted into voltage signals. A plurality of signals having specific wavelengths output as sampling signals obtained by the spectroscope 9 at any sampling time point i are temporarily stored in a storage device such as a RAM (not shown) as time series data yij. Here, j indicates a wavelength.

Next, the time series data yij output from the spectroscope 9 and temporarily stored in a storage device such as a RAM is transmitted to the first digital filter 10, waveforms having a frequency higher than a predetermined frequency, which are noise components, are removed, thereby smoothing processing is performed, and smoothed time series data Yij is temporarily stored in the storage device such as a RAM (not shown).

The smoothed time series data Yij temporarily stored in the storage device such as a RAM is transmitted to the differentiator 11, and the time series data dij of a differential value (first order differential value or second order differential value) at a predetermined sampling time point i is calculated and stored in the storage device such as a RAM (not shown). The time series data dij of the differential value temporarily stored in the storage device such as a RAM is transmitted to the second digital filter 12, smoothing processing is performed again, and smoothed differential coefficient time series data Dij is stored in the storage device such as a RAM (not shown).

Here, the calculation of the smoothed differential coefficient time series data Di will be described. A secondary Butterworth type low pass filter, for example, is used as the first digital filter 10. Smoothed time series data Yi by the secondary Butterworth type low pass filter is obtained by Equation (1).

$$Yi = b1 \cdot yi + b2 \cdot yi-1 + b3 \cdot yi-2 - [a2 Yi-1 + a3 \cdot Yi-2] \quad \text{(Equation 1)}$$

Here, coefficients a and b have different numerical values depending on a sampling frequency and a cutoff frequency. Coefficient values of the digital filter are, for example, a2=−1.143, a3=0.4128, b1=0.067455, b2=−0.013491, b3=0.067455 (sampling frequency is 10 Hz, and cutoff frequency is 1 Hz).

The time series data di of differential coefficient is calculated by the differentiator 11 from Equation (2) using a polynomial adapted smoothing differential method with the time series data Yi at five points as follows.

$$di = \sum_{k=-2}^{k=2} \omega k \cdot Yi + k \quad \text{(Equation 2)}$$

Here, with respect to the weight coefficient $\omega$, $\omega_{-2}=2$, $\omega_{-1}=-1$, $\omega_0=-2$, $\omega_1=-1$, and $\omega_2=2$.

The smoothed differential coefficient time series data Di by using the time series data di of the differential coefficient is calculated as follows from. Equation (3) by, for example, a secondary Butterworth type low pass filter as the second digital filter 12.

$$Di = b1 \cdot di + b2 \cdot di-1 + b3 \cdot di-2 - [a2 \cdot Di-1 + a3 \cdot Di-2] \quad \text{(Equation 3)}$$

The calculation can be performed for each wavelength j to obtain smoothed differential coefficient time series data Dij. A value obtained by dividing the smoothed differential coefficient time series data Dij by the smoothed time series data Yij is used as Dij in subsequent calculations. The smoothed differential coefficient time series data Dij may also be used as it is.

On the other hand, the differential waveform pattern database set 14 holds three or more differential waveform pattern databases 15. Each of the differential waveform pattern databases 15, stores in advance interference light pattern data P(m)sj obtained when a test processing target material having the same material, shape, and composition as the processing target material 4 which is to be processed for manufacturing a semiconductor device and a film structure on a surface thereof is etched under the same condition as the processing target material 4.

The differential waveform pattern database 15 stores a plurality of pieces of data measured in a plurality of different test processing target materials. m indicates an ID of a database, s indicates an elapsed time at a time of sampling counted from a start of the processing, and j indicates an emission wavelength. The interference light pattern data P(m)sj includes a pattern of intensity of the interference light from the processing target film, which corresponds to different remaining film thicknesses of the processing target film or a value of data indicating the remaining film thickness.

When the etching proceeds in a lateral direction as well, a parameter indicating a width of the processing target film area 213 or a width of the mask area 214 may be included instead of the remaining film thickness. The differential waveform pattern database 15 is stored in a memory device as a RAM or ROM, or a storage device such as a hard disk or a DVD disk inside the etching amount measuring unit 8 (not shown).

The differential waveform pattern databases 15 stored in the differential waveform pattern database set 14 is obtained from materials to be processed having slightly different fine shapes, such as thicker and thinner masks 201, due to manufacturing variations and the like. The differential waveform pattern databases 15 may be created by preparing test materials to be processed having slightly different fine shapes.

The individual film thickness calculator 13 is a process of extracting the remaining film thickness of the processing target film and the interference light pattern data P(m)sj from the above-mentioned differential waveform pattern databases 15. For example, for each of the above differential waveform pattern databases 15, data in which s is equal to or longer than a predetermined elapsed time and remaining film thickness data corresponding to the time may be extracted.

An elapsed time having the smallest pattern difference and a film thickness value at the time may be detected by comparing each of the above differential waveform pattern databases 15 with the actual pattern Dij of the interference light corresponding to the predetermined elapsed time. That is, differences between the pattern data P(m)sj stored in the differential waveform pattern databases 15 and the actual pattern Dij may be calculated, pattern data having the smallest difference value may be obtained, and the remaining film thickness corresponding to the pattern data may be extracted.

The interference light pattern data extracted in such manner is called Q(m)sj. The data is associated with a remaining film thickness at the elapsed time. The associated remaining film thickness is called r(m)s.

The weighted film thickness calculator 16 calculates a value of an instantaneous film thickness value Zi at the time point i by using the interference light pattern data Q(m)sj and the remaining film thickness data r (m) s extracted for each database. In order to calculate the instantaneous film thickness value Zi, a matrix R: 301 shown in FIG. 3A and a matrix Q: 302 shown in FIG. 3B are created here.

Figures 3A, 3B:
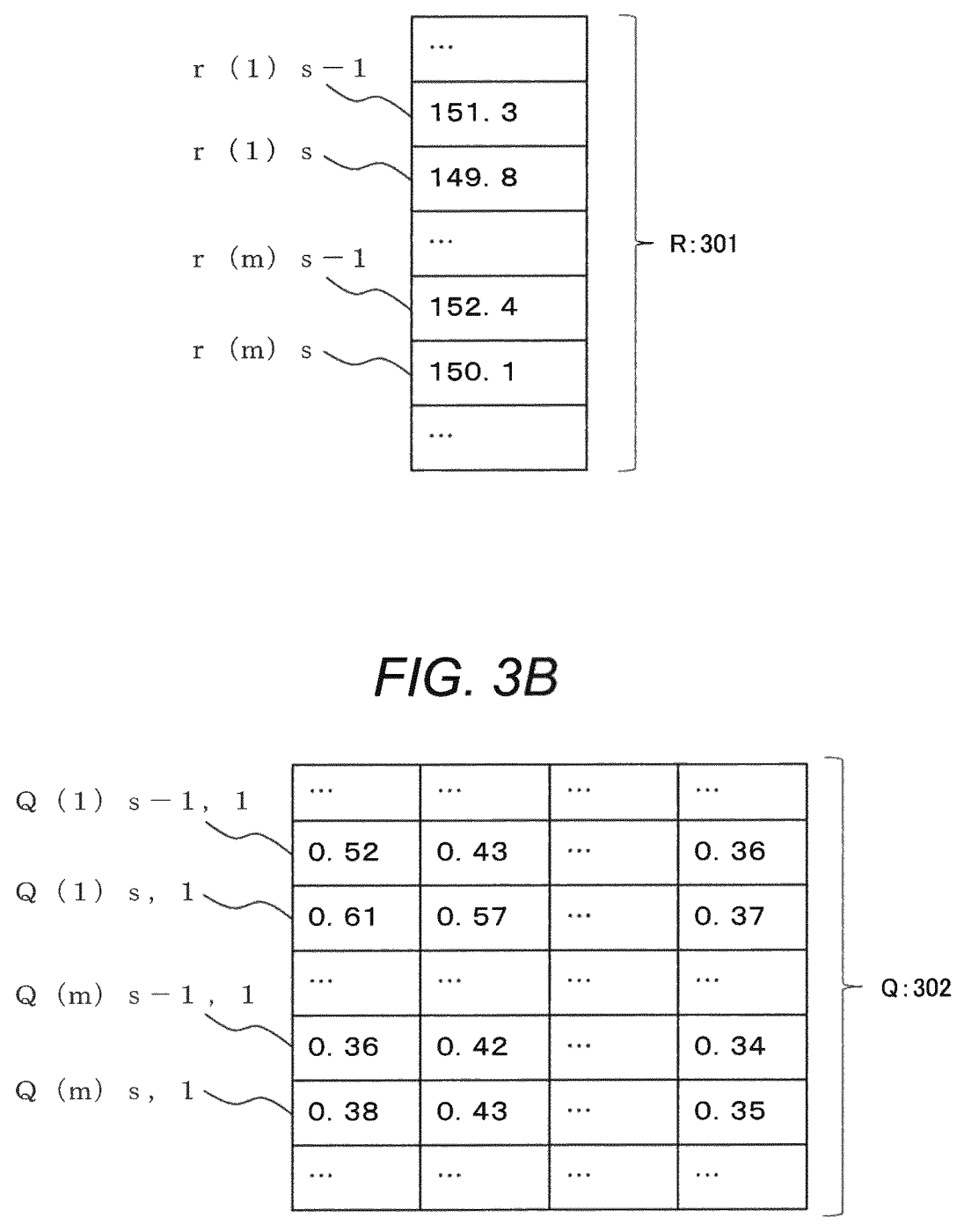

The matrix R: 301 in FIG. 3A is a matrix in which r(m)s are connected in an order from m=1 in a row direction. In the following, an element on the uth row is represented by Ru. The matrix Q: 302 in FIG. 3B is a matrix in which Q(m)sj are connected in an order from m=1 in a row direction. In the following, an element on the uth row and the wth column is represented by Quv. Ru and Quv are each associated with the same elapsed time in the same database. In the following, N is used as the number of rows.

The value of the instantaneous film thickness value Zi is calculated by the following Equations (4) and (5).

$$Zi = R^T \cdot A \cdot W \quad \text{(Equation 4)}$$

The above is a matrix calculation formula, and A and W are the following matrices, respectively. T represents a transpose.

A: a matrix for correction having N rows and N columns. A may also be a diagonal matrix having N rows and N columns, in which each element is a reciprocal of a sum of elements of W. Also, A may be an inverse matrix of (K-λI) like Kernel ridge regression. Here, K is a matrix having N rows and N columns in which an element on the uth row and the with column is kuv represented by the following Equation (5). λ is an arbitrary coefficient, and I is an identity matrix having N rows and N columns whose elements are 1.

$$kuv = \exp\left(-\sum_j (Quj - Qvj)^2 / 2\sigma^2\right) \quad \text{(Equation 5)}$$

In the above Equation (5), a wavelength range for summing j and a coefficient σ are specified by the values stored in the film thickness calculating recipe 17. exp is an exponential function with a base of the natural logarithm.

W: each element shows a weight according to a pattern difference between the smoothed differential value time series data Dij at the time point i and data in each database. For example, a value of the uth element Wu is calculated by a function that monotonically decreases according to a magnitude of the pattern difference, as in the following Equation (6).

$$wu = \exp\left(-\sum_j (Dij - Quj)^2 / 2\sigma^2\right) \quad \text{(Equation 6)}$$

In the above Equation (6), the wavelength range for summing j and the coefficient σ are specified by values stored in the film thickness calculating recipe 17 in the same manner as in the Equation (5).

By using the above Equation (6), the differential waveform pattern of the processing target material 4 at the time point i and the differential waveform pattern of each database that are more similar have a large value, and those that are less similar obtains a small weight. By using such weights in the Equation (4), the instantaneous film thickness value Zi is calculated from the remaining film thickness in databases having similar differential waveform patterns.

Figure 4:
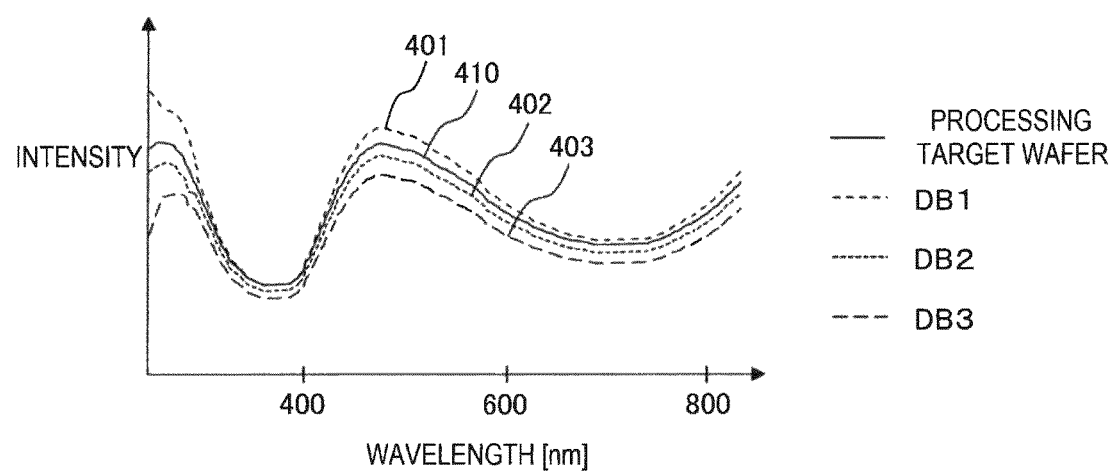
FIG. 4 is a graph showing a differential waveform pattern used in the calculation according to the embodiment of the invention.

For example, as shown in FIG. 4, when a differential waveform pattern 410 of the processing target material 4 and differential waveform patterns 401 to 403 of databases are obtained, by giving large weights to the differential waveform pattern 401 of DB1 and the differential waveform pattern 402 of DB2, and giving a small weight to the differential waveform pattern 403 of DB3, the instantaneous film thickness value Zi is calculated from the differential waveform pattern 401 of DB1 and the differential waveform pattern 402 of DB2, which are closer to the differential waveform pattern.

If the fine shape on the surface of the processing target material 4 is similar, the differential waveform pattern of the interference light also takes a similar pattern, and therefore, as a result, the instantaneous film thickness value Zi can be calculated using a database having a similar fine shape on the surface of the processing target material 4. A calculation equation of the weight Wu is not limited to Equation (6), and may be a function in which a small weight is calculated when the pattern difference is large.

The instantaneous film thickness value at the sampling time point is detected as Zi, and the value of the instantaneous film thickness value Zi is stored in the storage device in the etching amount measuring unit 8 as time series data.

The film thickness calculating recipe 17 is data for designating a wavelength range for summing in the above-mentioned equations (5) and (6) and the coefficient σ in the equations. The data may be determined by the designer or may be set by the recipe optimizer 21 to be described later.

In the regression analyzer 18, at the same time when an output from the weighted film thickness calculator 16 is received or data of the instantaneous film thickness Zi at the sampling time point i stored in the storage device is read, an instantaneous film thickness value before the time point i is read from the storage device, and the output or the data of the instantaneous film thickness Zi and the instantaneous film thickness value are used for a regression analysis, so as to calculate a film thickness value at the time point i from a result of regression line approximation.

That is, a first order regression line Y=Xa·t+Xb (Y: remaining film amount, t: etching time, Xa: an absolute value is an etching rate, Xb: initial film thickness) is obtained by the regression analyzer 18, and a value of a film thickness Yi (calculated film thickness) at the sampling time point i is calculated from the regression line. When a desired remaining film thickness of the processing target film is smaller than the remaining film thickness in the differential waveform pattern database 15, the film thickness value of the time point i may be calculated using only the first order regression line without calculating the instantaneous film thickness Zi.

Next, the data indicating the obtained value of the calculated film thickness Yi is transmitted to the end point determiner 19, in the end point determiner 19, the value of the film thickness Yi and a film thickness value that is a target of the etching processing (target film thickness) are compared, and when it is determined that the film thickness Yi is equal to or smaller than the target film thickness value, it is regarded that the etching amount of the film to be etched of the processing target material 4 arrives the target, and a result thereof is displayed on the display 20.

After that, generation of an electric field or a magnetic field of the plasma forming portion is stopped, the plasma 3 disappears, and the etching process of the processing target material 4 is completed, and then the processing conditions such as gas and pressure for the etching processing are changed to process the film to be etched.

Figure 5A:
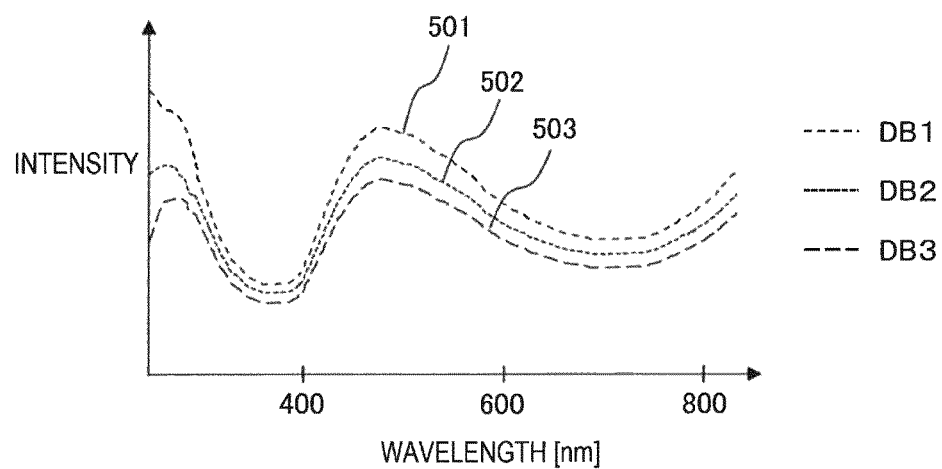
FIG. 5A is a graph showing variations in a differential waveform pattern extracted from a database used in the calculation according to the embodiment of the invention.

The recipe optimizer 21 performs a processing of setting the above-described film thickness calculating recipe 17. This is performed as a pre-processing before plasma processing of the processing target material 4 starts. The recipe optimizer 21 extracts a differential waveform pattern at a specified remaining film thickness (for example, target film thickness) from each database among the differential waveform pattern databases 15. Extracted differential waveform pattern 501 of the DB1, differential waveform pattern 502 of the DB2, and differential waveform pattern 503 of the DB3 are shown in FIG. 5A.

Figure 5B:
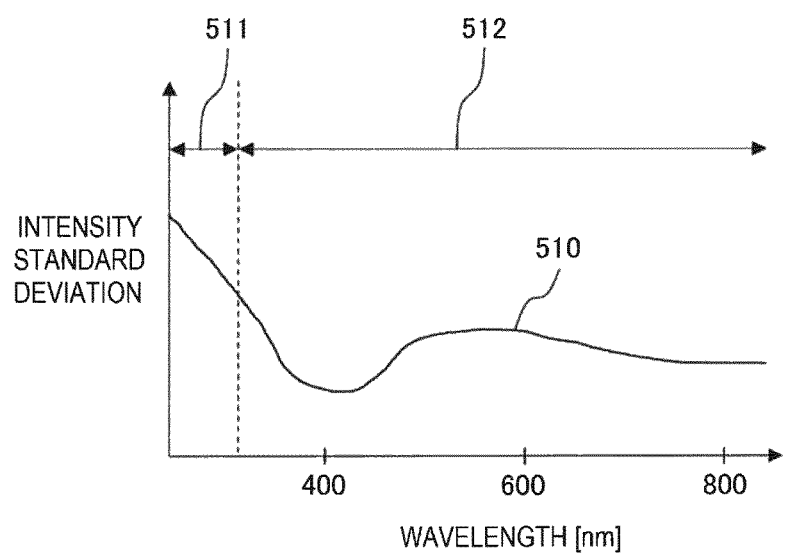
FIG. 5B is a graph showing a standard deviation obtained from the variations in a differential waveform pattern extracted from a database used in the calculation according to the embodiment of the invention.

A standard deviation 510, which is a variation in intensity at each wavelength of the extracted differential waveform pattern, is calculated as shown in FIG. 5B. Since it is assumed that the intensity varies depending on factors other than the remaining film thickness, such as states of the plasma or the chamber, the accuracy can be improved by excluding the wavelength with a large variation.

Therefore, in FIG. 5B, the wavelength range is stored in the film thickness calculation recipe 17 such that the instantaneous film thickness Zi is calculated using only the wavelength range of 512, while excluding wavelengths having a large standard deviation as shown in 511 from wavelengths for summing in Equations (4) and (5).

The wavelength range to be excluded may be determined in relative magnitude such as the wavelength of top 10% or 20% of the variation among all wavelengths, or a threshold value may be set for the variation. When a differential waveform pattern of a database is divided into a plurality of groups, standard deviations for the groups may be calculated respectively, and an average thereof may be used.

To determine a percentage of wavelength ranges to be excluded, the recipe optimizer 21 extracts one database (DBp) among the differential waveform pattern databases 15 and calculates the instantaneous film thickness using the Equation (4) using the remaining differential waveform pattern databases 15.

For candidates in the plurality of wavelength ranges, for example, when the top 10% variation is excluded, and when the top 20% variation is excluded, respectively, an instantaneous film thickness Zs at the time point s of DBp is calculated, a difference from the film thickness r(m)s is calculated, and the wavelength range having a smaller difference is selected as an optimum wavelength range.

For the coefficients σ in the Equations (5) and (6), a plurality of coefficients σ may be set for calculating the instantaneous film thickness Zs, and combinations of the wavelength range and the coefficient σ may be processed to specify the combination having a small difference. The wavelength range and the coefficient σ specified in such manner are stored in the film thickness calculating recipe 17.

In the present embodiment, by using the Equation (6), the film thickness is calculated by a weighted sum of a plurality of databases having a small difference from the differential waveform pattern obtained from the processing target material 4 in the plurality of databases. Since a more similar differential waveform pattern can be obtained from processing target materials having similar fine shapes, even when the fine shape of the processing target material 4 varies, databases of processing target materials having similar fine shapes can be used, so that the end point can be determined accurately.

Figure 6:
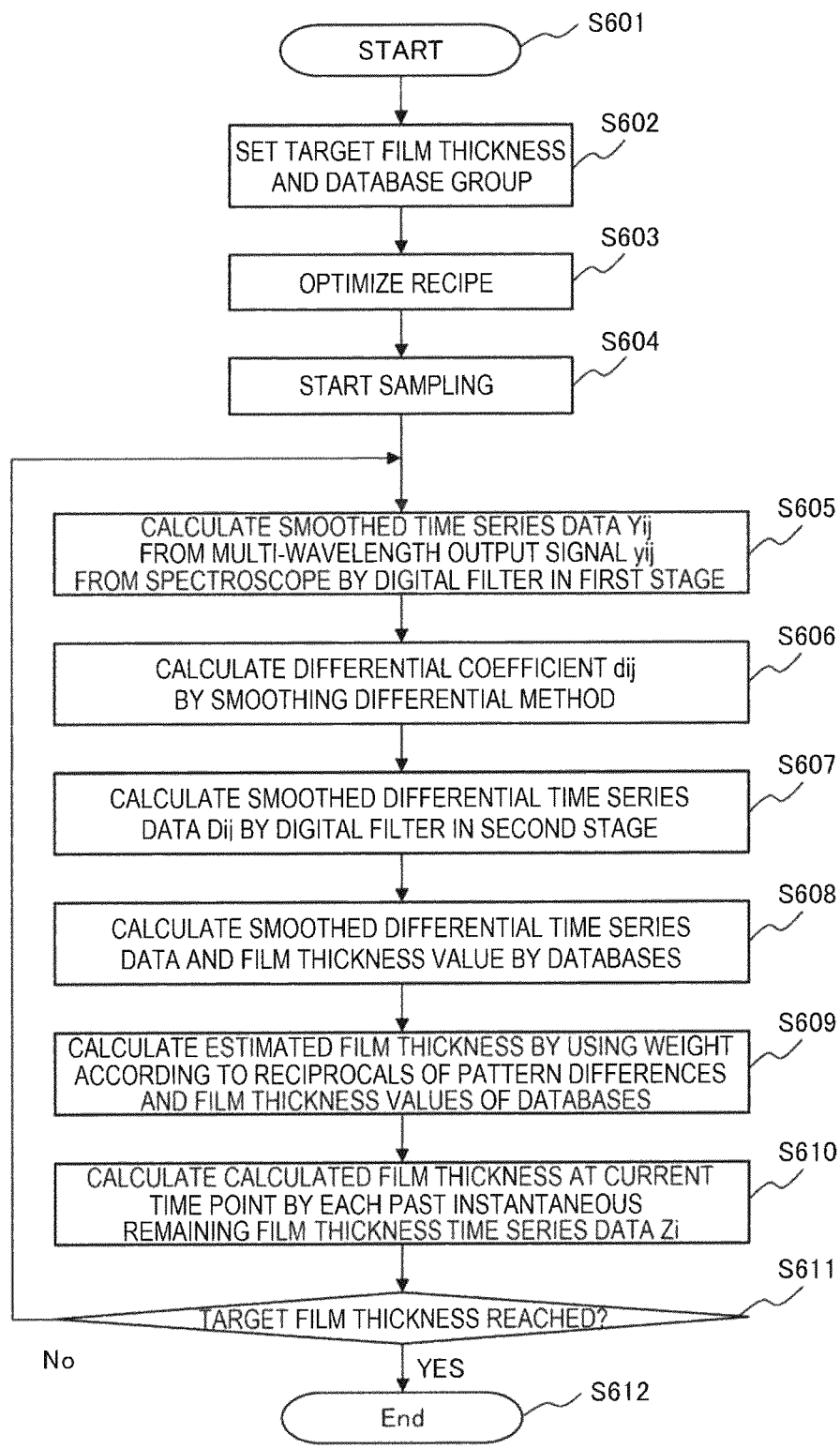
FIG. 6 is a flowchart showing a procedure for calculating a remaining film thickness or an etching amount of the processing target film in the etching process according to the embodiment of the invention.

Next, a procedure for calculating the remaining film thickness or the etching amount of the processing target film when the etching processing is performed by the etching amount measuring unit 8 of FIG. 1 will be described using the flowchart of FIG. 6. FIG. 6 is a flowchart showing a flow of an operation for detecting a remaining film thickness etching amount of the plasma processing apparatus according to the embodiment shown in FIG. 1. FIG. 6 mainly shows a flow of an operation of the etching amount measuring unit 8. A processing starts from step S601.

In the embodiment, a value of a target remaining film thickness of the processing target film and a plurality of differential waveform pattern databases used for detection or determination thereof are set (step S602) prior to the processing of the processing target material 4.

In the differential waveform pattern databases, interference light pattern data obtained when the test processing target material having the same material, shape, and composition as the processing target material 4 which is to be processed for manufacturing the semiconductor device and the film structure on the surface thereof is etched under the same condition as the processing target material 4 is used as the data P(m)sj collected for the plurality of processing target materials.

Next, a processing of optimizing the wavelength range and the coefficient used for calculating the instantaneous film thickness is performed (step S603). The processing will be described with reference to a flowchart in FIG. 7 described later. A wavelength range and a coefficient specified in advance may be used without executing the processing.

Next, the plasma 3 is formed in the vacuum processing chamber 2, the processing on the film to be etched of the material 4 is started, and interference light obtained from the film to be etched during the etching processing is detected at predetermined sampling intervals (for example, 0.1 to 0.5 seconds) (step S604). At the time, a sampling start command is issued upon the start of the etching processing.

During the processing, an intensity of multi-wavelength interference light that changes as the etching progresses is transmitted to the spectroscope 9 of the etching amount measuring unit 8, and is detected and output by a light detection device thereof as a light detection signal having a voltage corresponding to the intensity of light at each predetermined frequency.

The light detection signal of the spectroscope 9 is digitally converted, and the sampling signal yij as a data signal associated with an arbitrary time point is acquired. Next, the multi-wavelength output signal yij from the spectroscope 9 is smoothed by the first digital filter 10 in a first stage, and the time series data Yij at the arbitrary time point is calculated (step S605).

Next, the time series data Yij is transmitted to the differentiator 11, and the time series differential coefficient dij is calculated by the polynomial adapted smoothing differential method (step S606). That is, the differential coefficient di of the signal waveform is detected by the polynomial adapted smoothing differential method.

The differential coefficient dij is transmitted to the second digital filter 12 in a second stage, and the smoothed differential coefficient time series data Dij is calculated (step S607). The obtained smoothed differential coefficient time series data Dij is divided by the smoothed time series data Yij and transmitted to the individual film thickness calculator 13.

Although the smoothed differential coefficient time series data Dij is used here, any value may be used as long as it is time series data that reflects the difference in the processing target material 4, such as Yij itself, or a value calculated by using a least squares method on Yij.

In the individual film thickness calculator 13, the remaining film thickness and the interference light pattern data Q(m) sj of the processing target film is extracted for each of the plurality of the differential waveform pattern databases 15 in the differential waveform pattern database set 14 (step S608).

For example, for each of the above differential waveform pattern databases 15, data in which s is equal to or longer than a predetermined elapsed time and remaining film thickness data corresponding to the time are extracted.

Alternatively, an elapsed time from the start of the etching processing may be obtained, and data having an elapsed time s within a predetermined range (for example, ±10 seconds) from the elapsed time and remaining film thickness data corresponding to the time may be extracted.

Alternatively, for each of the above differential waveform pattern databases 15, an elapsed time having the smallest pattern difference obtained by comparing with the actual pattern Dij of the interference light corresponding to the predetermined elapsed time and a remaining film thickness at the time may be extracted.

Next, the weighted film thickness calculator 16 calculates a value of the instantaneous film thickness value Zi at the time point i by using the interference light pattern data Q(m)sj and the remaining film thickness data r(m)s extracted for each database (step S609).

For the calculation of the instantaneous film thickness value Zi, the matrix Q in which the patterns extracted from each differential waveform pattern database 15 are combined with the data Q(m)sj, and the matrix R in which the remaining film thicknesses Ru extracted in a similar manner are combined are created.

The value of the instantaneous film thickness value Zi is calculated by substituting Q, R, and the smoothed differential value time series data Dij at the time point i into the above Equations (4), (5) and (6). The wavelength range for summing and the coefficient $\sigma$ in the Equations (5) and (6) use a predetermined value or a value determined by the flow shown in FIG. 7, which will be described later.

Next, the regression analyzer 18 obtains the first order regression line using the calculated instantaneous film thickness value Zi and the instantaneous film thickness Zi at the sampling time point i stored in the storage device, and calculates the calculated film thickness following the first order regression line (step S610).

Further, the current calculated film thickness of the processing target film is compared with the target remaining film thickness set in step S302, and when it is determined that the thickness is equal to or less than the target remaining film thickness, it is determined that the target is reached, and a signal for ending the etching processing is transmitted to the plasma processing apparatus 1 (step S611). When it is determined that the target is not reached, the processing returns to step S305. If it is determined that the target is reached, a setting of a sampling end is finally performed (step S612).

Figure 7:
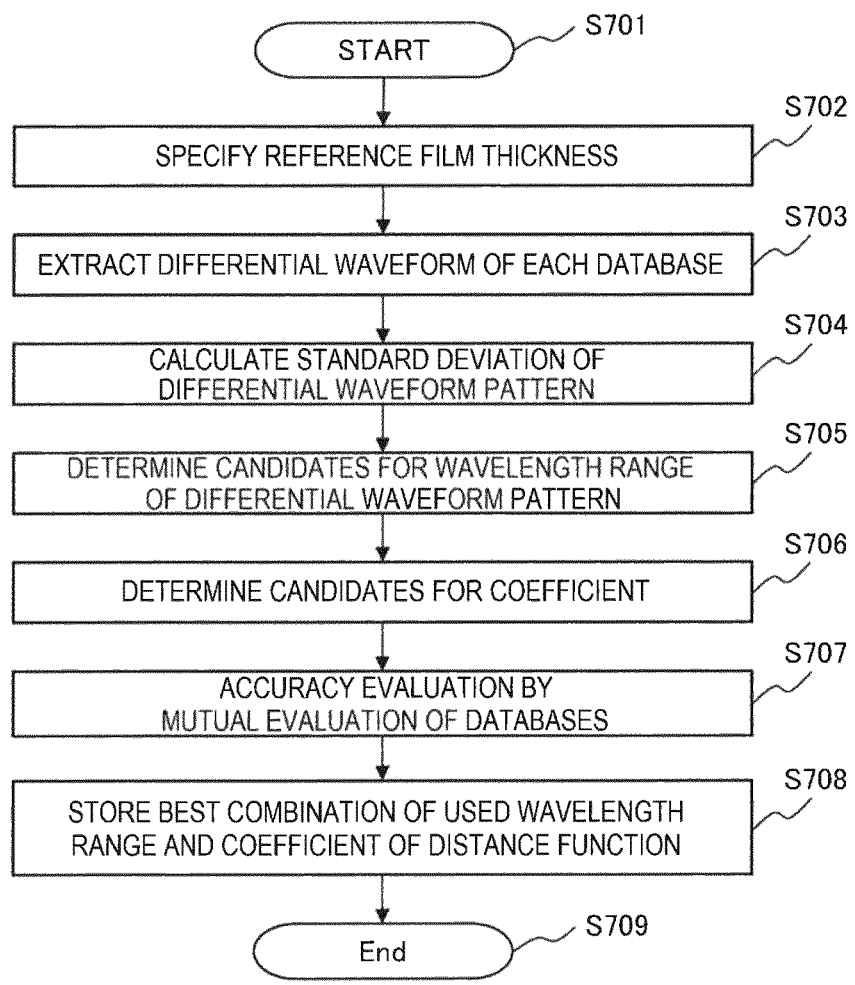
FIG. 7 is a flowchart showing a detailed procedure of recipe optimization in step S603 of the flowchart in FIG. 6.

Next, using the flowchart of FIG. 7, a procedure for performing the recipe optimization processing performed by the etching amount measuring unit 8 in FIG. 1 corresponding to S603 in FIG. 6 will be described. A processing starts from step S701.

First, the recipe optimizer 21 determines the remaining film thickness for comparing the differential waveform patterns (reference film thickness). The film thickness may be, for example, a target remaining film thickness (step S702).

Next, in each differential waveform pattern database 15, pattern data P(m)sj of the differential waveform at the reference film thickness is extracted (step S703).

Next, the standard deviation of P(m)sj for each wavelength j is calculated by using the extracted pattern data P(m)sj (step S704).

Next, wavelengths are relatively excluded in a descending order of the standard deviation, and the remaining wavelength ranges are used as candidates for wavelength ranges to be used (step S705). Here, a plurality of candidates are created, such as a case where 10% is excluded and a case where 20% is excluded.

Next, a plurality of candidates for the coefficient $\sigma$ in Equations (5) and (6) are created (step S706).

Then, a processing is performed in which one database among the differential waveform pattern databases 15 is extracted, the instantaneous film thickness is calculated using the Equation (4) using the remaining differential waveform pattern databases 15, and an error from the remaining film thickness data r(m)s is calculated (step S707). The processing is performed for combinations of the wavelength range and the coefficient σ so as to specify a combination having a small error.

As described above, the specified wavelength range and the coefficient σ are stored in the film thickness calculating recipe 17 (step S708).

Thereafter, the processing is ended (S709).

Figure 8:
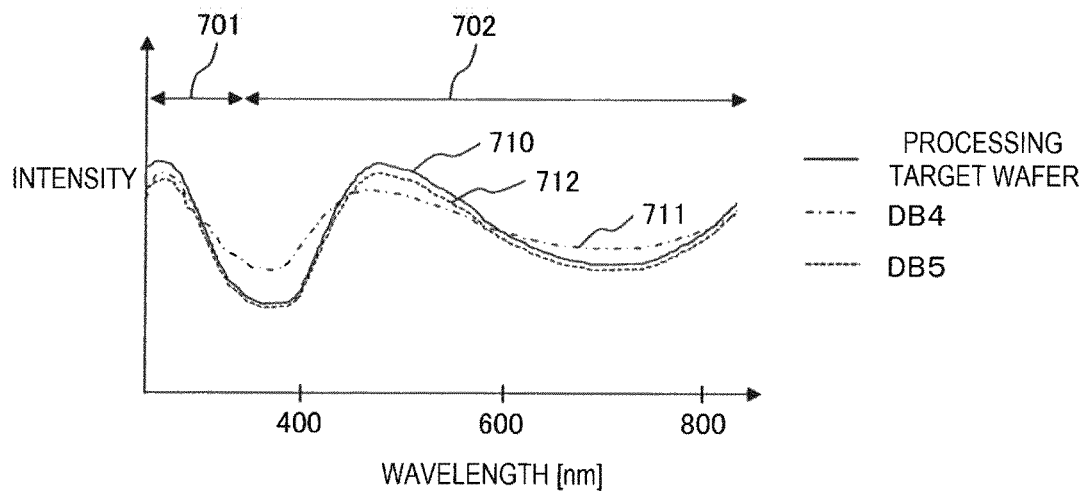
FIG. 8 is a graph showing a differential waveform pattern obtained by detecting reflected light from a wafer to be processed and a differential waveform pattern stored in the database that explains an effect of the etching process according to the embodiment of the invention, and shows that the film thickness can be detected with high accuracy by using differential waveform pattern databases measured on test semiconductor wafers with similar fine shapes by weighting the differential waveform pattern databases, even when the fine shape of the processing target material varies.

An effect of the present embodiment will be described with reference to FIG. 8. Here, the differential waveform pattern 810 obtained by detecting the reflected light from the processing target material 4 and two differential waveform pattern databases 15 are taken as examples. In the differential waveform pattern 811 of DB4 in FIG. 8, comparing with the processing target material 4, the processing target film area 213 of the test semiconductor wafer (test processing target material) in which the differential waveform pattern database 15 is measured is smaller, and the mask film thickness 211 is thicker. In the differential waveform pattern 812 of DB5, comparing with the processing target material 4, the processing target film area 213 of the test semiconductor wafer in which the differential waveform pattern database 15 is measured is of the same degree, and the mask film thickness 211 is of the same degree.

In the wavelength range 802 in FIG. 8, a time change of the interference light of the processing target film 202 is mainly measured. In the wavelength range 801, not the time change of the interference light of the processing target film 202 but a sum of the time change of the interference light of the mask 201 thinner than the processing target film with the time change of the interference light of the processing target film is measured.

Here, a case is considered in which the differential waveform pattern 811 of the DB4 and the differential waveform pattern 810 of the processing target material 4 are compared, and a film thickness when a difference between the two is small is used in the instantaneous film thickness calculation. First, in DB4, since the processing target film area 213 of the processing target material 4 is small, the time change of the interference light of the processing target film 202 to be measured is small, and an amplitude of the differential waveform pattern in the wavelength range 802 is smaller than that of the processing target material 4. Therefore, when the differential waveform pattern 811 of the DB4 is used, the differential waveform pattern indicating the interference light of the processing target film 202 does not match, and a calculation accuracy of the difference in the differential waveform pattern is reduced.

This also means that the differential waveform pattern having a small difference in the time change (wavelength range 801) of the interference light of the mask film thickness 211 is selected, and thus the differential waveform pattern 811 in a case where the mask film thickness 211 is close to the thickness, that is, in the state where the etching is more advanced in DB4 (when the processing target film 202 is thin) is selected, which generates an error in the instantaneous film thickness calculation.

In such manner, it can be seen that if a differential waveform pattern database 15 of a test semiconductor wafer having a different fine shape on the processing target material 4 is used, a calculation accuracy of the remaining film thickness is lowered. On the other hand, in a processing target material 4 having a similar fine shape, the difference in the differential waveform pattern becomes small as in the differential waveform pattern 812 in DB5.

Therefore, by weighting the differential waveform pattern database 15 using the difference in the differential waveform pattern, the film thickness can be detected with high accuracy by using differential waveform pattern databases 15 measured on test semiconductor wafers with similar fine shapes in each processing target material 4, even when the fine shape of the processing target material 4 varies.

According to the present embodiment, highly accurate film thickness estimation and end point determination under various structural variations between wafers, lots, and the like can be achieved, and a yield of device manufacturing can be improved.

Second Embodiment

In this embodiment, using data obtained in the past mass-production process upon a plurality of processing target materials (wafers), the film structure on the surface of which or the material, shape and composition of such structure are equivalent to those of the processing target material 4 having been subjected to the etching processing under the same conditions as for the processing target material 4, a case is presented where the corresponding ones of the differential waveform pattern database 15 and the differential waveform pattern database set 14 explained in the first embodiment are prepared.

In this embodiment, 200 wafers, the film structure on the surface of which or the material, shape and composition of such structure are equivalent to those of the processing target material 4 are subjected to the etching processing by setting the target remaining film thickness of the processing target film to (140 nm defined here). Then, using the data P(m) sj of the interference light patterns obtained by the etching processing and the value data of the film thicknesses of the processing target films corresponding to the data P(m) sj of the respective interference light patterns, the differential waveform pattern database set 114, in which the differential waveform pattern databases 151 of the 200 wafers are included, is created.

The processing target films on the 200 wafers are planned to be subjected to the etching processing up to the predetermined target film thickness (140 nm). However, actually, according to the chronological change of the ambient within the etching processing chamber and difference in the fine shape of the processing target material surfaces, the etching processing conditions with respect to the processing target film on each wafer change, so that the remaining film thickness of the processing target film after the etching processing varies according to each wafer. That is to say, the wafers for which the etching processing is over with the thinner remaining film thickness than targeted and those for which it is over with the thicker remaining film thickness than targeted are present together.

Figure 9:
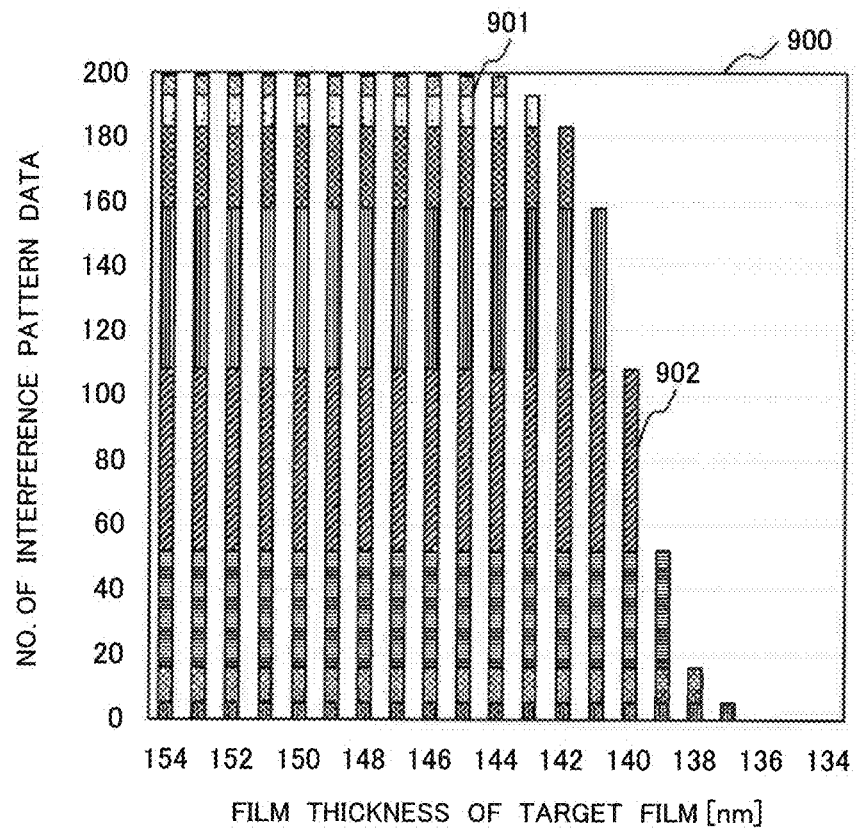
FIG. 9 is a diagram illustrating the number of interference light pattern data associated with each film thickness stored in the differential waveform pattern database set 14 according to the second embodiment of the present invention.

The graph 900 illustrated in FIG. 9 shows in a stack-up bar graph form the number of the interference light pattern data P(m) sj associated with each film thickness stored in the differential waveform pattern database set 114 created by using the data obtained from the 200 wafers with the same legend patterns provided for each wafer having the same remaining film thickness after the etching processing.

The number of the interference light pattern data pieces P(m) sj amounts to 200 data pieces which is the same as the number of all the wafers up to the remaining film thickness (the thickness of the processing target film) or 145 nm depicted in the data 901, but it gradually reduces as the remaining film thickness (the thickness of the processing target film) becomes smaller than 144 nm. In the case of the target remaining film thickness being 140 nm as depicted in the data 902, the number amounts to mere 108. In the mass-production in which the actual wafer products are subjected to the etching processing as well, it is predicted that the number in the vicinity of the target remaining film thickness reduces likewise.

The above situation is considered with reference to the graph depicted in FIG. 8 which is referred to in the first embodiment. For instance, the etching processing with respect to the wafer corresponding to DB5:812 is over with the thicker remaining film thickness than targeted, in which it is thought that there is no interference light pattern data of DB5 in the target remaining film thickness. In this case, the interference light pattern in the state where the etching is more advanced in DB4:811 (when the processing target film 202 is thin) is selected, so that an error in the calculation of the instantaneous film thickness value Zi occurs.

In this way, it is considered that the accuracy with which to determine the end point of the etching processing deteriorates due to no presence of the data P(m) sj of the interference pattern corresponding to the target remaining film thickness in some or all of the differential waveform pattern databases 15 which are included in the differential waveform database set 14 which is referred to in the first embodiment.

In this embodiment, the method for determining the end point of the etching processing with high accuracy even when there might be shortage in the interference light pattern data corresponding to the film thickness in the vicinity of the target remaining film thickness as mentioned above is described.

Figure 10:
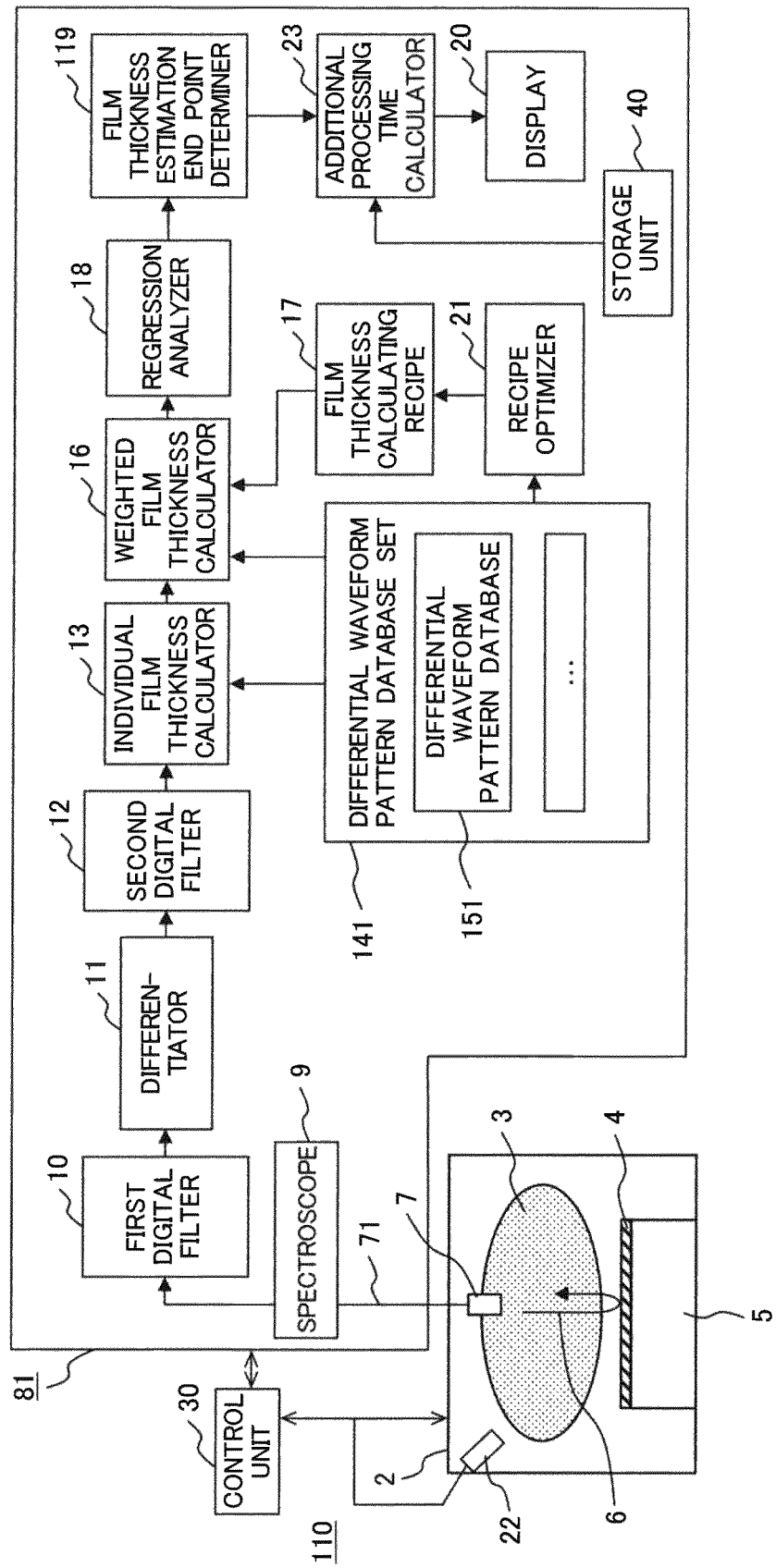
FIG. 10 is a block diagram to illustrate the schematic arrangement of the plasma processing apparatus according to the second embodiment of the invention.

The plasm processing apparatus 110 according to the second embodiment is illustrated in FIG. 10. The difference with the plasm processing apparatus 1 illustrated in FIG. 1 according to the first embodiment lies in that the etching amount measuring unit 81 is provided with a film thickness estimation end point determiner 119 in replacement of the end point determiner 19, a storage unit 40 to store the value data of the calculated film thicknesses over the past time points during the processing, and an additional processing time calculator 23 in addition to the differential waveform pattern database 151 and the differential waveform pattern database set 114. The other arrangements are the same as those of the plasma processing apparatus 1 according to the first embodiment illustrated in FIG. 1 and bring the same operational effects as explained in the first embodiment, so that their detailed explanation is omitted to avoid redundancy.

With the plasm processing apparatus 110 according to the second embodiment, using the method for calculating the instantaneous film thickness value Zi based on the equations (4), (5), and (6) in the same way as the first embodiment, the etching processing is performed until the processing target film reaches the predetermined remaining film thickness by which the accuracy within the tolerable range is obtained; the additional etching time required for reaching the target remaining film thickness is calculated using the etching rate that is calculated based on the remaining film thickness data detected over the past time points after it has been detected that the processing target film reaches the predetermined remaining film thickness; and the etching processing ends after the etching processing is continuously performed just by the calculated additional etching time.

Figure 11:
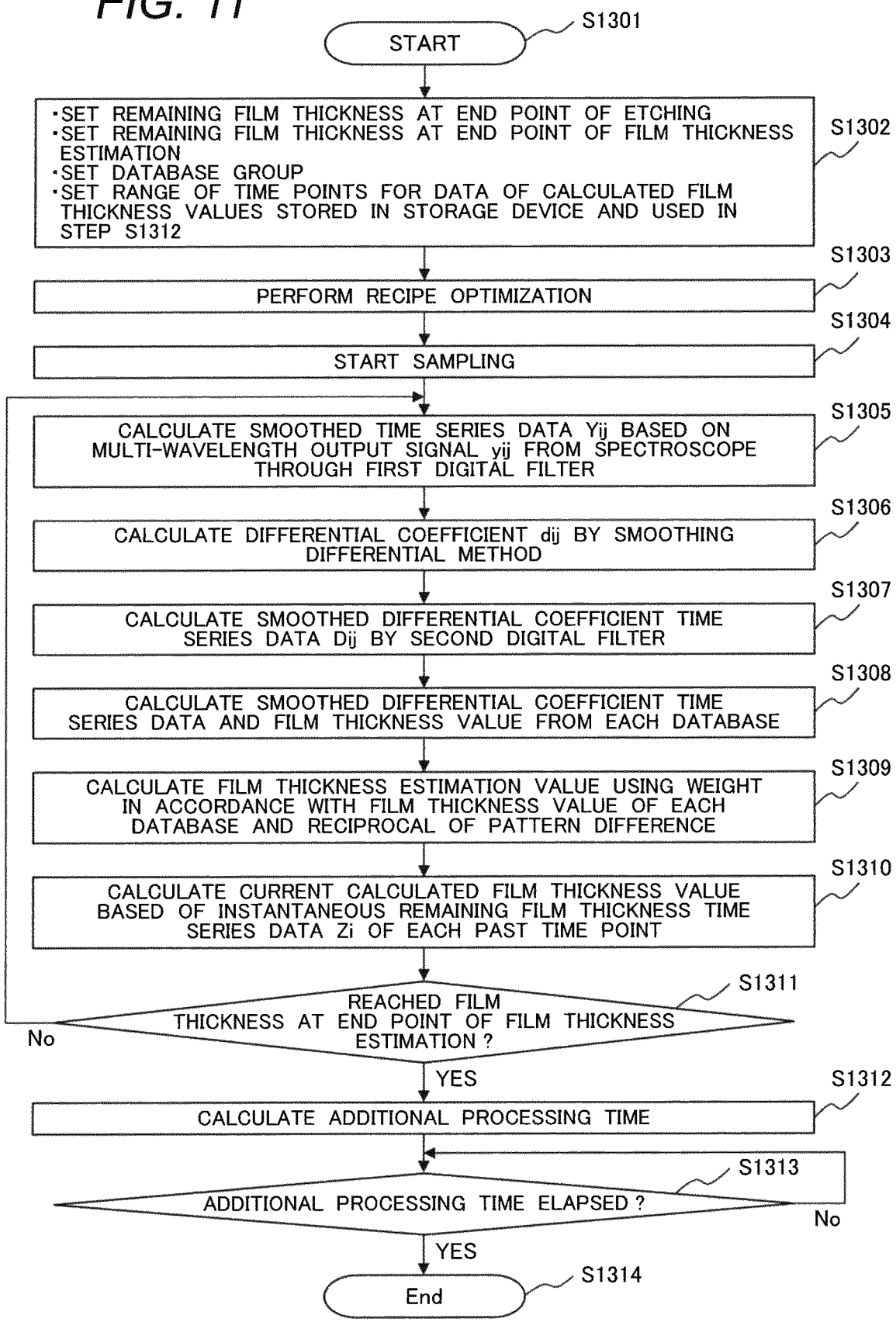
FIG. 11 is a flowchart showing the processing steps according to the second embodiment of the invention.

FIG. 11 is a flowchart illustrating the operational flow to detect the remaining film thickness or the etching amount of the processing target film and to determine the end point of the etching processing according to the plasma processing apparatus 110 of the second embodiment illustrated in FIG. 10, in which mainly the operational flow of the etching amount measuring unit 81 is depicted. The processing starts from step S1301.

In the present embodiment, before the processing target material 4 is processed, the value of the target remaining film thickness (or the remaining film thickness at the end point of the etching) is set; the value of the remaining film thickness to finish calculating the instantaneous film thickness value Zi (or the remaining film thickness at the end point of the film thickness estimation) using the aforementioned equations (4), (5), and (6) is set; a plurality of differential waveform pattern databases employed for the calculation of the instantaneous film thickness value Zi using the aforesaid equations (4), (5), and (6) is set; and the range of the time points is set, over which the value data of the calculated film thicknesses to be used for obtaining the first order regression line in step S1312 is extracted from the value data of the calculated film thickness at each time point during the etching processing which is stored in the storage device (step S1302). To note, the remaining film thickness at the end point of the etching is thinner than the remaining film thickness at the end point of the film thickness estimation.

The thinnest film thickness among the remaining film thicknesses within the tolerable range of the calculation accuracy of the instantaneous film thickness value Zi is set for the remaining film thickness at the end point of the film thickness estimation according to the present embodiment. The thinnest film thickness is defined as 144 nm in the present embodiment so that the remaining film thickness at the end point of the film thickness estimation is set to 144 nm.

Further, the remaining film thickness value at the end point of the etching according to the present embodiment is set to 140 nm corresponding to the data 902 depicted in the graph 900 of FIG. 9. Moreover, the range of the time points over which the value data of the calculated film thicknesses to be used for obtaining the first order regression line in step 1312 is extracted from the value data of the calculated film thickness at each time point during the etching processing which is stored in the storage device is set to 5 seconds or from 5 seconds retrospectively before reaching the end point of the film thickness estimation to the time reached at the end point of the film thickness estimation.

The interference light pattern data P(m) sj which is obtained when a plurality, three or more, of wafers, the film structure on the surface of which or the material, shape and composition of the structure are the same as those of the processing target material 4, is subjected to the etching processing under the same conditions as for the processing target material 4 and the film thickness value data corresponding to the respective interference light pattern data pieces P(m) sj are adopted for the differential waveform pattern database 151.

Then, the recipe optimization which is the processing to optimize the wavelength range and the coefficient to be used for the calculation of the instantaneous film thickness is performed (step S1303). This processing is the same as explained with the flowchart of FIG. 7 in the first embodiment. In turn, the predefined wavelength range and coefficient may be used without performing the present processing.

Subsequently, the film to be etched of the processing target material 4 starts to be subjected to the etching processing by forming the plasma 3 within the vacuum processing chamber 2, and the interference light obtained from the processing target film during the etching processing is detected by the light receiver 7 at the prescribed sampling interval (for example, 0.1 to 0.5 seconds) (step 1304). Hereupon, the sampling start command is issued in accordance with the start of the etching processing.

During the etching processing, the intensity of the multi-wavelength interference light that changes according to the progress of the etching is transmitted to the spectroscope 9 of the etching amount measuring unit 81, and the transmitted intensity is detected and output by the spectroscope 9 as a light detection signal having a voltage according to the intensity of light at each prescribed frequency.

The light detection signal of the spectroscope 9 is converted into a digital signal, thereby, a sampling signal yij as a data signal associated with an arbitrary time point being acquired. Then, the multi-wavelength output signal yij from the spectroscope 9 is smoothed by the first digital filter 10, and the time series data Yij at the arbitrary time point is calculated (step S1305).

Then, the time series data Yij is transmitted to the differentiator 11, and the time series differential coefficient dij is calculated by a polynomial adapted smoothing differential method (step S1306). That is to say, the differential coefficient di of the signal waveform is detected by the polynomial adapted smoothing differential method.

The differential coefficient dij is transmitted to the second digital filter 12, and the smoothed differential coefficient time series data Dij is calculated (step 1307). The calculated smoothed differential coefficient time series data Dij is divided by the smoothed time series data Yij so as to be transmitted to the individual film thickness calculator 13.

To note, herein, the smoothed differential coefficient time series data Dij is put to use, but any value such as Yij itself or a value calculated by using a least squares method on Yij may be used as long as it is the time series data on which difference in the ambient within the processing chamber is reflected.

In the individual film thickness calculator 13, the remaining film thickness and the interference light pattern data Q(m) sj of the processing target film are extracted for each of the plurality of differential waveform pattern databases 151 present in the differential waveform pattern database set 141 (step S1308).

Then, in the weighted film thickness calculator 16, using the interference light pattern data Q(m) sj and the remaining film thickness data r(m) s which are extracted for each database, the instantaneous film thickness value Zi at the time point i is calculated (step S1309).

In order to calculate the instantaneous film thickness value Zi, the matrix Q in which the patterns extracted from each differential waveform pattern database 151 are combined with the data Q(m) sj and the matrix R in which the remaining film thicknesses Ru extracted in a similar way are combined are created.

The value of the instantaneous film thickness value Zi is calculated by substituting Q, R, and the smoothed differential value time series data Dij at the time point i into the above Equations (4), (5), and (6). The wavelength range for summing and the coefficient σ in the Equations (5) and (6) use a predetermined value or a value determined by the flow shown in FIG. 7, which will be described later.

Next, the regression analyzer 18 obtains the first order regression line using the calculated instantaneous film thickness value Zi and the instantaneous film thickness Zi at the sampling time point i stored in the storage device, and calculates the calculated film thickness following the first order regression line (step S1310).

Then, in the film thickness estimation end point determiner 119, the current calculated film thickness of the processing target film in step S1310 is compared with the remaining film thickness at the endpoint of the film thickness estimation set in step S1302 (step S1311), and when it is determined that the current thickness is equal to or less than the remaining film thickness at the end point of the film thickness estimation, it is determined that the processing target film has reached the end point of the film thickness estimation (Yes in step S1311) and the processing proceeds to step S1312. When it is determined that it has not reached the end point (No in step S1311), the processing returns to step S1305.

Figure 12:
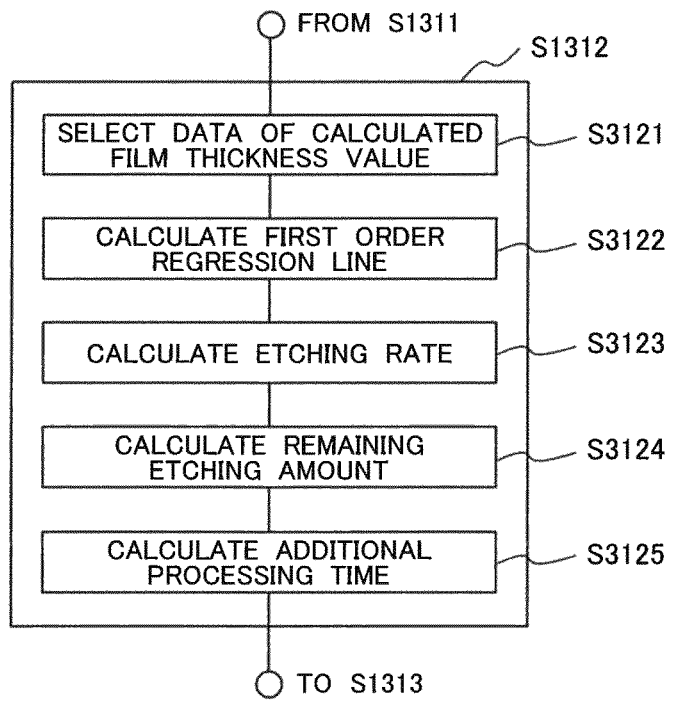
FIG. 12 is a flowchart showing the detailed procedures of step 1312 of the flowchart illustrated in FIG. 11.

Subsequently, the detail of step S1312 is depicted in FIG. 12. When the processing proceeds to step S1312, the additional processing time calculator 23 selects the data of the calculated film thickness values of plural time points within the range of time points set in step S1302 from among the data of the calculated film thickness values over the past time points during the processing which is stored in the storage unit 40 (step S3121) and calculates the first order regression line Y=Xc·t+Xd (Y: remaining film thickness, t: etching time, Xc: an absolute value is an etching rate, Xd: initial film thickness) using the selected calculated film thickness time series data (step S3122). However, the first order regression line calculated in the present step S3122 is another regression line different from the first order regression line calculated in step S1310. Through the present step S3122, the etching rate is calculated (step S3123). Further, the difference between the current calculated film thickness of the processing target film for which the determination as to having reached the end point of the film thickness estimation is made in step S1311 and the remaining film thickness at the end point of the etching is calculated as a remaining etching amount (step S3124) and an additional processing time required for reaching the remaining film thickness at the end point of the etching is calculated by dividing the remaining etching amount by the etching rate (step S3125).

Then, the processing proceeds to step S1313 and the etching processing is continued for the additional processing time calculated in step S1312 from the time point when the determination as to having reached the end point of the film thickness estimation is made (No in step S1313), and when the calculated additional processing time has elapsed (Yes in step S1313), the signal to make the etching processing end is transmitted to the plasma processing apparatus 1. Lastly, a setting of a sampling end is performed so as to end the processing (step S1314).

Figure 13:
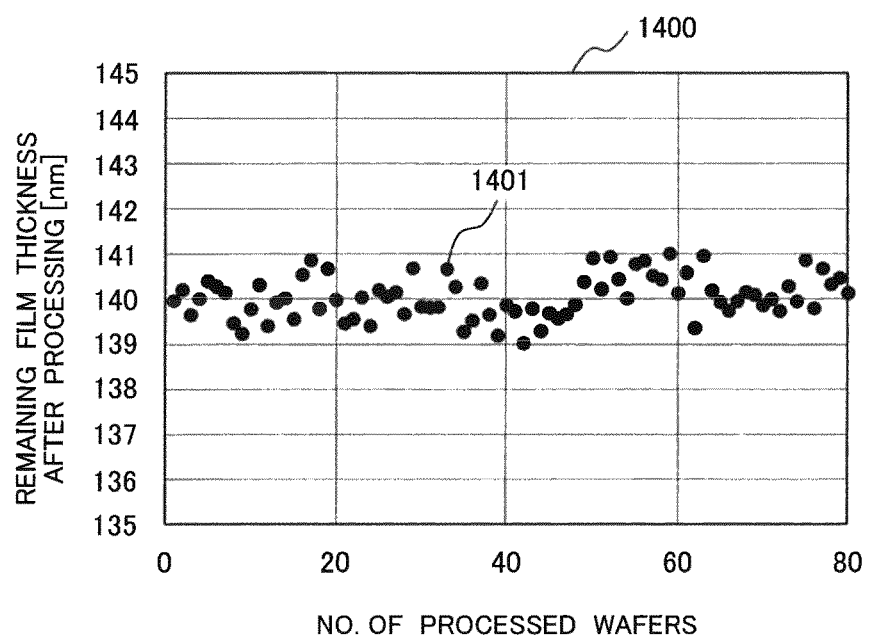
FIG. 13 is a graph showing variations of the remaining film thicknesses after the processing for each processed wafer to explain the effect brought by the second embodiment of the invention.

The results from the etching endpoint determination made using the above embodiment are illustrated in FIG. 13. With reference to the graph 1400 of FIG. 13, the reference numeral 1401 denotes the remaining film thicknesses of the processed wafers after the etching processing or the graph depicted in FIG. 13 as a whole shows the variations of the remaining film thicknesses after the etching processing. The remaining film thicknesses after the etching processing are in the vicinity of the target remaining film thickness or 140 nm for the entire wafers, in which it is found that the etching processing is realizable with high processing precision because an error among the variations is contained within ±1.0 nm.

Based on such results, according to the present embodiment, it is found that the etching end point can be determined with high accuracy even when there is no presence of the interference light pattern data P(m) sj corresponding to the target remaining film thicknesses which are stored in some or all of the differential waveform pattern databases 151 present in the differential waveform pattern database set 141.

Third Embodiment

In this embodiment, a case is presented where the thinnest film thickness among the remaining film thicknesses that every differential waveform pattern database 151 present in the differential waveform pattern database set 141 explained in the second embodiment has in common is set to the remaining film thickness at the end point of the film thickness estimation. The other conditions are the same as those of the plasma processing apparatus 110 according to the second embodiment and bring the same operational effects as explained in the second embodiment, so that their detailed explanation is omitted to avoid redundancy.

In this embodiment, the thinnest film thickness among the remaining film thicknesses that the differential waveform pattern databases 151 present in the differential waveform pattern database set 141 have in common is defined as 145 nm corresponding to the data 901 with reference to the graph 900 of FIG. 9. Thus, the remaining film thickness value at the end point of the film thickness estimation in step S1302 of FIG. 11 explained in the second embodiment is set to 145 nm; the remaining film thicknesses are calculated using the aforementioned equations (4), (5), and (6) until the remaining film thickness or 145 nm is detected according to the flow shown in FIG. 11; and the etching processing is additionally performed for the time calculated in step S1312 after the detection of the end point of the film thickness estimation so as to determine as to having reached the end point of the etching processing.

As a result, the same accuracy with which to determine the endpoint of the etching as the second embodiment is obtained. Accordingly, through the method according to the present embodiment, it is found that the etching end point can be determined with high accuracy even when there is no presence of the interference light pattern data P(m) sj corresponding to the target remaining film thicknesses which are stored in one part or the whole of differential waveform pattern databases 151 present in the differential waveform pattern database set 141.

While the invention made by the inventor has been described in detail based on the embodiments, the invention is not limited to the above-described embodiments, and various modifications can be made without departing from the scope of the invention. For example, the above-described embodiments have been described in detail for easy understanding of the invention, and the invention is not necessarily limited to those including all the configurations described above. Further, a part of the configuration of each embodiment may be added, deleted, or replaced with another configuration.

What is claimed is:

1. A plasma processing method using a plasma processing apparatus that generates plasma in a state where an inside of a vacuum processing chamber is exhausted to vacuum, so as to process a processing target film formed on a processing target material, the plasma processing method comprising:
   a step of detecting, by a light emission detection unit, light emission of the plasma generated inside the vacuum processing chamber;
   a step of obtaining, by a calculation unit, a differential waveform data of the light emission of the plasma detected by the light emission detection unit;
   a step of calculating, by a film thickness calculation unit, an estimated value of the film thickness of the processing target film processed on the processing target material by weighting based on differences between the differential waveform data obtained by the calculation unit and a plurality of pieces of differential waveform pattern data stored in a database unit; and
   a step of determining, by an end point determination unit, an end point of processing using the plasma based on the estimated value of the film thickness of the processing target film calculated by the film thickness calculation unit.

2. The plasma processing method according to claim 1, wherein calculation by the film thickness calculation unit of the estimated value of the film thickness of the processing target film is performed by using a plurality of databases having different interference spectrum patterns due to differences in a film thickness and a structure stored in the database unit.

3. The plasma processing method according to claim 1, wherein
   calculation by the film thickness calculation unit of the estimated value of the film thickness of the processing target film is performed by using a plurality of pieces of differential waveform pattern data in a wavelength range excluding a part having a standard deviation larger than a predetermined value, which standard deviation is a variation in intensity at each wavelength of a plurality of pieces of differential waveform pattern data corresponding to a specified reference film thickness among the plurality of pieces of differential waveform pattern data stored in the database unit.

4. The plasma processing method according to claim 1, wherein
   the light emission detection unit detects reflected light of light projected to the processing target material from a light source for projecting light to the processing target material.

5. The plasma processing method according to claim 1, wherein
   calculation of the estimated value of the film thickness of the processing target film is performed by calculating weight based on the differences between the differential waveform data of the light emission of the plasma obtained by the calculation unit and the pieces of differential waveform pattern data stored in the database unit, and calculating the estimated value of the film thickness of the processing target film by using the calculated weights and the differential waveform pattern data stored in the database unit.

6. The plasma processing method according to claim 5, wherein
   when calculating the estimated value of the film thickness of the processing target film, as the weight calculating based on the differences between the differential waveform data of the light emission of the plasma obtained by the calculation unit and the pieces of differential waveform pattern data stored in the database unit, the film thickness calculation unit sets a first value when the differential waveform data of the light emission of the plasma obtained by the calculation unit at a certain time point and the differential waveform pattern data of each database are more similar, and sets a second value smaller than the first value when the differential waveform data and the differential waveform pattern data are less similar.

7. A plasma processing method using a plasma processing apparatus that generates plasma in a state where an inside of a vacuum processing chamber is exhausted to vacuum, so as to process a processing target film formed on a processing target material, the plasma processing method comprising:

a step of detecting, by a light emission detection unit, light emission of the plasma generated inside the vacuum processing chamber;

a step of obtaining, by a calculation unit, a differential waveform data of the light emission of the plasma detected by the light emission detection unit;

a step of calculating, by a film thickness calculation unit, an estimated value of the film thickness of the processing target film processed on the processing target material by weighting based on differences between the differential waveform data obtained by the calculation unit and a plurality of pieces of differential waveform pattern data stored in a database unit;

a step of processing the processing target film until the estimated value of the film thickness calculated by the film thickness calculation unit reaches a predetermined remaining film thickness; and a step of further processing the processing target film for as long as processing time obtained by an additional processing time calculator and required for the predetermined remaining film thickness to reach a target film thickness when the estimated value of the film thickness calculated by the film thickness calculation unit has reached the predetermined remaining film thickness.

8. The plasma processing method according to claim 7, comprising a step of designating a wavelength range to calculate a difference between the differential waveform data obtained by the calculation unit using interference spectra data and film thickness data collected in advance and the plurality of pieces of differential waveform pattern data stored in the database unit, wherein at that step, the wavelength range is designated by excluding wavelength ranges in which the interference spectra have a variation in the same film thickness that is larger than a predetermined value.

9. The plasma processing method according to claim 7 wherein in the additional processing time calculator, an etching rate is calculated based on the estimated values of the film thicknesses at plural time points which are calculated by the film thickness calculation unit, and the processing time required for reaching the target film thickness is obtained based on the calculated etching rate and the predetermined remaining film thickness.

* * * * *